United States Patent

Goddard et al.

[11] Patent Number: 5,878,266
[45] Date of Patent: Mar. 2, 1999

[54] RESERVATION STATION FOR A FLOATING POINT PROCESSING UNIT

[75] Inventors: Michael D. Goddard; Kelvin D. Goveas; Norman Bujanos, all of Austin, Tex.

[73] Assignee: Advanced Micro Devices, Inc., Sunnyvale, Calif.

[21] Appl. No.: 533,725

[22] Filed: Sep. 26, 1995

[51] Int. Cl.[6] .................................................. G06F 15/82
[52] U.S. Cl. ...................... 395/800.23; 395/393; 395/394
[58] Field of Search .................................... 395/800, 394, 395/800.23, 393, 390, 391, 563

[56] References Cited

U.S. PATENT DOCUMENTS

| | | | |
|---|---|---|---|
| 3,930,232 | 12/1975 | Wallach et al. | 340/172.5 |
| 4,161,784 | 7/1979 | Cushing et al. | 364/748 |
| 4,631,696 | 12/1986 | Sakamoto | 364/748 |
| 4,789,956 | 12/1988 | Hildebrandt | 364/736.5 |
| 4,823,260 | 4/1989 | Imel et al. | 364/200 |
| 4,928,223 | 5/1990 | Dao et al. | 364/200 |
| 4,941,120 | 7/1990 | Brown et al. | 364/748 |
| 5,053,631 | 10/1991 | Perlman et al. | 364/748 |
| 5,058,048 | 10/1991 | Gupta et al. | 364/748 |
| 5,095,458 | 3/1992 | Lynch et al. | 364/787 |
| 5,128,888 | 7/1992 | Tamura et al. | 364/748 |
| 5,128,891 | 7/1992 | Lynch et al. | 364/767 |
| 5,155,816 | 10/1992 | Kohn | 395/375 |
| 5,155,820 | 10/1992 | Gibson | 395/375 |
| 5,206,828 | 4/1993 | Shah et al. | 364/784 |
| 5,226,126 | 7/1993 | McFarland et al. | 395/375 |
| 5,257,215 | 10/1993 | Poon | 364/745 |
| 5,262,973 | 11/1993 | Richardson | 364/736 |
| 5,317,526 | 5/1994 | Urano et al. | 364/715.03 |
| 5,339,266 | 8/1994 | Hinds et al. | 364/748 |
| 5,481,686 | 1/1996 | Dockser | 395/375 |
| 5,499,352 | 3/1996 | Clift et al. | 395/412 |
| 5,574,928 | 11/1996 | White et al. | 395/394 |
| 5,632,023 | 5/1997 | White et al. | 395/800 |
| 5,651,125 | 7/1997 | Witt et al. | 395/394 |

FOREIGN PATENT DOCUMENTS

| | | |
|---|---|---|
| 0 287 115 A2 | 10/1988 | European Pat. Off. . |
| 0 363 222 | 11/1990 | European Pat. Off. . |
| 0 450 802 A2 | 10/1991 | European Pat. Off. . |
| 0 651 321 A1 | 5/1995 | European Pat. Off. . |
| 0 679 992 A1 | 11/1995 | European Pat. Off. . |
| 94/27205 | 11/1994 | WIPO . |

OTHER PUBLICATIONS

Donald Alpert, et al., Architecture of the Pentium Microprocessor, IEEE Micro, vol. 13, No. 3, Jun. 1993, pp. 11–21.

Arnel B. Enriquez, et al., Design of a Multi–Mode Pipelined Multiplier for Floating–Point Applications, Feb. 1991, pp. 77–81.

Mike Johnson, "Superscalar Microprocessor Design" (Book), 1991.

(List continued on next page.)

Primary Examiner—Larry D. Donaghue
Attorney, Agent, or Firm—Skjerven, Morrill, MacPherson, Franklin & Friel, L.L.P.; Stephen A. Terrile

[57] ABSTRACT

A reservation station with format conversion logic enables the implementation of a superscalar computer processing system which incorporates both a floating point functional unit and non-floating point functional units. By converting operand data in a floating point reservation station from external formats to an internal floating point format, a system incorporating such a floating point reservation station enables the representation of operand data in uniform external formats outside floating point arithmetic units (e.g., in a reorder buffer, on operand and result busses, and within non-floating functional units) while also enabling the use of a specialized internal representation (internal floating point format) within floating point arithmetic units. A system incorporating multiple functional units and such a floating point reservation station enables the use of superscalar techniques for exploiting parallelism between floating point and non-floating point instructions because operands and results are externally represented in uniform external formats. Specialized logic within the floating point reservation station converts operand formats.

36 Claims, 7 Drawing Sheets

OTHER PUBLICATIONS

R.M. Tomasulo, "An Efficient Algorithm For Exploiting Multiple Arithmetic Units", V32 IBM Journal of R&D, Jan. 1967, vol. 11, pp. 25–33.

Kai Hwang et al, "Computer Architecture And Parallel Processing", Copyright 1984, pp. 170–174.

Intel, "Microprocessor Family Programmer's Reference Manual", 1992, pp. 15–1 thru 16–28.

IEEE, "IEEE Standard For Radix–Independent Floating-–Point Arithmetic", Copyright 1987, pp. 7–16.

IEEE, "IEEE Standard For Binary Floating–Point Arithmetic", Copyright 1985, pp. 7–17.

R.M. Tomsaulo, "An Efficient Algorithm For Exploiting Multiple Arithmetic Units", Jan. 1967, pp. 293–305.

Intel486™ Microprocessor Family Programmer's Reference Manual, ©1992, Chapter 15, pp. 15–1—15–2, Chapter 16, pp. 16–28.

Vojin G. Oklobdzija, "An Algorithmic and Novel Design of a Leading Zero Detector Circuit: Comparison with Logic Synthesis", IEEE Transactions on Very Large Scale Integration (VLSI) Systems, ©1994, pp. 124–128.

RESERVATION STATION FOR A FLOATING POINT PROCESSING UNIT

BACKGROUND OF THE INVENTION

1. Field of the Invention

This invention relates to a superscalar processor and, more particularly, to a reservation station for a functional unit within a superscalar processor which includes a plurality of functional units.

2. Description of the Relevant Art

As is known in the art, a floating point number may be represented in binary format as an exponent and a mantissa. The exponent represents a power to which a base number such as 2 is raised and the mantissa is a number to be multiplied by the base number. Accordingly, the actual number represented by a floating point number is the mantissa multiplied by a quantity equal to the base number raised to a power specified by the exponent. In such a manner, any particular number may be approximated in floating point notation as $f \times B^e$ or (f,e) where f is an n-digit signed mantissa, e is an m-digit signed integer exponent and B is the base number system. In most computer systems, the base number system used is the binary number system where B=2, although some systems use the decimal number system (B=10) or the hexadecimal number system (B=16) as their base number system. Floating point numbers may be added, subtracted, multiplied, or divided and computing structures for performing these arithmetic operations on binary floating point numbers are well known in the art.

In a practical computer, the mantissa portion of a number is not of infinite "precision" (i.e. there are not an unlimited number of digits which may be assigned to the mantissa of a floating point number). Instead, floating point numbers are normally processed in a register with a fixed number of digits. Thus, although two input operands to be added, subtracted, multiplied, or divided may each be exact representations, the result of the operation may create more significant digits than the fixed number of digits in the register. As a result, a less precise (but still accurate) representation of the result must be squeezed into the fixed number of digits in the register by the processes of normalization and rounding.

Normalization is the process which assures that all floating point numbers with the same value have the same representation. Typically, normalization of a binary floating point number is accomplished by shifting the bits of the mantissa to the left until the most significant bit is a one. The exponent is decreased so that the value of the product of the mantissa and base number raised to the power of the exponent remains constant. Since the most significant bit in the mantissa of a normalized number is always a one, floating point representations often represent the bit implicitly (effectively freeing up one bit position for use as an additional bit of precision). Together these significant bits, whether they include an explicit or an implicit most significant bit, are known as the significand. The normalization process maximizes the number of significant bits represented in this significand. Rounding a floating point number is the process of reducing the precision of a number, so as to fit a representation of the number into a smaller number of significand bits. For floating point number representations, four rounding modes are typical: round up, round down, round to nearest, and truncate (see Dewar, *Microprocessors: A Programmer's View*, McGraw-Hill Publishing Co., New York, 1990, pp. 140–143 for a discussion).

The finite number of digits in the exponent also places limits on the magnitude of numbers which can be represented. Arithmetic results which exceed these limits are known as underflow and overflow. There are two ranges of numbers that correspond to arithmetic overflow and arithmetic underflow, respectively. If the result of an arithmetic operation is greater than the largest positive value representable or less than the most negative value representable, arithmetic overflow occurs. On the other hand, when the result of an arithmetic operation is too small to be expressed, either positive or negative arithmetic underflow has occurred.

Floating point exponents are typically represented with bias (i.e., the biased exponent is equal to the sum of the true exponent value and a bias constant). The bias constant, which is typically $2^{n-1}-1$, where n is the number of exponent bits, allows a biased exponent to be represented as an unsigned integer. This unsigned representation simplifies comparison logic by allowing the exponent of two floating point numbers to be compared bitwise from left to right. The first bit position which differs serves to order the numbers and the true exponent can be determined by subtracting the bias from the biased exponent.

A series of floating point formats exist which represent different trade offs between the precision and range of numbers Gargest to smallest) representable, storage requirements, and cycles required for computing arithmetic results. In general, longer formats trade increased storage requirements and decreased speed of arithmetic operations (mainly multiplication and division operations) for greater precision and available range.

ANSI IEEE Standard 754 defines several floating point formats including single-precision, double-precision, and extended double-precision. Referring to FIG. 1a, the format of a 32-bit single precision floating point number is broken into a one-bit sign field "s," an eight-bit biased exponent field "exp," a so called "hidden" bit (which although not explicitly represented, is assumed to be a one just left of the implied binary point 11), and a 23-bit "significand."

Referring next to FIG. 1b, the format of a double-precision floating point number increases the size of the biased exponent field to eleven (11) bits and the size of the significand to fifty-two (52) bits. A hidden bit, which is assumed to be one, is implicit (just to the left of the implied binary point 12) in the double-precision format.

Referring next to FIG. 1c, the minimum requirements of an extended double-precision (hereinafter extended-precision) floating point format are presented. According to ANSI IEEE Standard 754, at least sixty-four (64) bits of significand and fifteen (15) bits of biased exponent must be provided. In contrast with single- and double-precision formats, extended-precision floating point format places the implied binary point 13 within the significand, and the digit to the left of the binary point is explicitly represented. There is no "hidden" bit; instead, the most significant bit of the significand (shown as "h" in FIG. 1c) is explicit in extended-precision format. Although envisioned in the IEEE standard as an internal format for computation of intermediate results, the format is in practice supported by many floating point units, including the i80387™ by Intel Corporation, as an external format (i.e., represented in memory and accessible to the programmer).

To maximize computational throughput, a number of superscalar techniques have been proposed to enable instruction-level parallelism using multiple functional units. Instruction parallelism can be described as the opportunity for simultaneous (parallel) execution of more than one instruction in a processor containing multiple functional units. Pipelining techniques involve exploitation of instruction parallelism within a single functional unit, whereas superscalar techniques involve the exploitation of instruction parallelism across more than one functional unit. The instruction parallelism exploited by superscalar techniques may be contrasted with data parallelism in that superscalar techniques enable the parallel execution of dissimilar instructions, not just identical instructions with independent operands. These techniques, which are known in the art of superscalar processor design, include out-of-order instruction issue, out-of-order instruction completion, and speculative execution of instructions.

Out-of-order instruction issue involves the issuance of instructions to functional units with little regard for the actual order of instructions in executing code. A superscalar processor which exploits out-of-order issue need only be constrained by dependencies between the output (results) of a given instruction and the inputs (operands) of subsequent instructions in formulating its instruction dispatch sequence. Out-of-order completion, on the other hand, is a technique which allows a given instruction to complete (e.g., store its result) prior to the completion of an instruction which precedes it in the program sequence. Finally, speculative execution involves the execution of an instruction sequence based on predicted outcomes (e.g., of a branch). Speculative execution (i.e., execution under the assumption that branches are correctly predicted) allows a processor to execute instructions without waiting for branch conditions to actually be evaluated. Assuming that branches are predicted correctly more often than not, and assuming that a reasonably efficient method of undoing the results of an incorrect prediction is available, the instruction parallelism (i.e., the number of instructions available for parallel execution) will typically be increased by speculative execution (see Johnson, *Superscalar Processor Design*, Prentice-Hall, Inc., New Jersey, 1991, pp. 63–77 for an analysis).

Architectural designs for exploiting the instruction parallelism associated with each of these techniques have been proposed in a variety of articles and texts. For a discussion, see Johnson, pp. 127–146 (out of order issue), pp. 103–126 (out-of-order completion and dependency), pp. 87–102 (branch misprediction recovery). Two architectural approaches for exploiting instruction parallelism are the reservation station and the reorder buffer. A reservation station is essentially an instruction and operand buffer for a given functional unit within a processor which includes multiple functional units; however, in addition to buffering instructions and operands, a reservation station provides a means for directly receiving results from other functional units. In this way, an instruction for which operands are not yet available can be dispatched to the reservation station for a given functional unit without waiting for its operands to be stored in and then retrieved from a register. Tomasulo, "An Efficient Algorithm for Exploiting Multiple Execution Units," IBM Journal, vol. 11, January 1967, pp. 25–33, discloses a floating point processor implementation which includes multiple functional units, each with a reservation station. Tomasulo used the term "execution unit" rather than "functional unit," but in this context the concept is similar.

A reorder buffer is a content-addressable store which maintains the speculative (i.e., out-of-order) state of registers in a processor which includes multiple functional units. When each instruction is decoded, a reorder-buffer entry is allocated to store the instruction's result and a temporary identifier, or tag, is created to identify the result. In a normal instruction sequence, a given register may be written many times and therefore multiple reorder buffer entries will be allocated, corresponding to the state of the register at different points in the instruction sequence. As instructions which require register values as operands are dispatched, the most recently allocated reorder buffer entry is referenced, or if no reorder buffer entry corresponds to the required register location, the value stored in the register file is used. Assuming that a corresponding reorder buffer entry has been allocated, the value of an operand required by a given instruction is supplied by the reorder buffer if the instruction which computes the operand value has completed; otherwise, a tag is supplied allowing the instruction to recognize the result when it becomes available. A superscalar processor design which incorporates a reorder buffer also provides facilities to retire reorder buffer entries (i.e., store the entry value to the register file or discard the entry if no longer needed).

A reorder buffer implementation facilitates various superscalar techniques including register renaming, branch misprediction exception handling, and out-of-order instruction completion. A superscalar architecture which includes reservation stations and a reorder buffer also facilitates the exploitation of instruction parallelism among functional units which receive operands from, and store their results to, a reorder buffer.

Typically, floating point units have been implemented as a co-processor with special-purpose floating point registers internal to the unit and using internal floating point formats which meet or slightly exceed the minimum requirements of IEE 754 for extended-precision floating point numbers. Internal floating point registers are often implemented as a register stack (see e.g., Intel, i486™ Microprocessor Family Programmer's Reference Manual, pp. 15-1 through 15-2) or as a series of accumulators (see e.g., U.S. Pat. No. 5,128, 888, "Arithmetic Unit Having Multiple Accumulators" to Tamura, et al. Such architectures convert operand data from external formats (e.g., single-, double-, and extended-precision floating point) to an internal format when operands are loaded into the internal floating point registers. Subsequent floating point instructions operate on data stored in these registers and intermediate results (represented in internal format) are written back to the internal registers. Finally, results are converted back to an external format and transferred to general purpose registers external to the floating point unit. Non-floating point operations (e.g., branch tests, stores to memory, I/O, etc.) must typically be performed on the floating point values stored in an external format in the general purpose registers.

A design for a floating point unit which includes multiple functional units, reservation stations, and a reorder buffer is shown in Johnson, pp. 44–45. FIG. 2 depicts the block diagram of a processor incorporating such a floating point unit 21 together with an integer unit 22. The processor includes a pair of register file (23 and 24) and a pair of reorder buffers (25 and 26); the first register file/reorder buffer combination is dedicated to the integer unit while the second combination is dedicated to the floating point unit. The processor design shown in FIG. 2 maintains independent integer and floating point registers (and reorder buffers); therefore, results which are computed within one operational unit (integer or floating point) and which are required as operands in the other operational unit must be transferred to the second unit for use in subsequent calculations.

SUMMARY OF THE INVENTION

An advantage of the present invention is the integration of a floating point functional unit which represents data in an internal format with other functional units which represent data in external formats. By enabling the use of a single data store for operands consumed and results generated by both the floating point unit and other functional units, the present invention enables the use of superscalar techniques for exploiting parallelism among instructions executed by the floating point functional unit and the other functional units.

Another advantage of the present invention is the ability to use floating point arithmetic pipelines for integer arithmetic. Superscalar techniques may be used to exploit parallelism among integer instructions executed by the floating point functional unit and those executed by other functional units.

These and other advantages are realized in the present invention, which in one embodiment is a reservation station for a floating point functional unit within a processor having multiple functional units coupled to a common opcode bus, a common operand bus, and a common result bus. The floating point functional unit includes an arithmetic unit. The reservation station includes a pending instruction buffer with an operand data register, bus interface logic, and first format conversion logic. The bus interface logic is coupled between the common operand bus and common result bus, on the one hand, and the operand data register, on the other, to selectively receive operand data into an operand data register of the pending instruction buffer. The first format conversion logic is coupled between the operand data register and the operand input of the arithmetic unit to supply the arithmetic unit with operand data selectively converted from one of a set of external data formats to one of a set of internal data formats.

In another embodiment, the reservation station also includes second format conversion logic coupled between the result output of the arithmetic unit and the common result bus. The second format conversion logic receives a result data value in one of the set of internal data formats, converts the result data value to one of the set of external data formats, and supplies the converted result data value on the common result bus.

In yet another embodiment, the reservation station also includes a fast-forward data path and means for detecting a correspondence between an operand needed for an instruction buffered in the pending instruction buffer and a result value from the arithmetic unit. The fast-forward data path is coupled between the result output of the arithmetic unit and the operand input of the arithmetic unit to selectively supply the arithmetic unit with an arithmetic result. The detecting means is coupled between the pending instruction buffer and the fast-forward data path. A correspondence detection causes the detecting means to selectively enable the fast-forward data path.

In still other embodiments, the floating point functional unit includes multiple arithmetic units such as a multiplication and addition pipelines. In still further embodiments, the first format conversion logic selectively converts an integer operand from external 16-, 32-, and 64-bit integer formats to encode the integer operand as an unnormalized floating point value within the normal alignment of the internal extended-precision format. Selective conversion of the integer operand allows the arithmetic unit of the floating point functional unit to operate on integer operands.

In still further embodiments, the first format conversion logic of the reservation station selectively passes internal format operands, and the second format conversion logic selectively passes internal format results, to allow representation of a floating point register structure external to the floating point functional unit. For example, the externally represented floating point register structure can be an x86 floating point stack, wherein first and second format conversion logic allow internal format and external format operands to be represented in a register file/reorder buffer external to the floating point functional unit.

Yet another embodiment of the present invention is a superscalar digital computer system having multiple functional units. The computer system includes an instruction decoder for furnishing opcodes and operand pointers, a data store for storing and retrieving data in a first data format, an operand bus for furnishing operands to functional units in the first data format, a result bus for communicating results from functional units in the first data format, and first and second functional units for performing operations on operands in response to opcodes received from the instruction decoder. The first functional unit performs an operation in response to a first type of opcode and includes a first reservation station, an arithmetic unit for performing arithmetic operations on operands in the second data format and for furnishing results in the second data format, and a data format converter for converting results from the second data format to the first data format. The first reservation station includes a first operand buffer, bus interface logic for selectively receiving results from the result bus, and a data format converter for converting operand data from the first data format to a second data format. The second functional unit performs an operation in response to a second type of opcode and includes a second reservation station and an execution unit. The second reservation station includes an operand buffer and bus interface logic for selectively receiving results from the result bus.

BRIEF DESCRIPTION OF THE DRAWINGS

The present invention may be better understood, and its numerous objects, features, and advantages become apparent to those skilled in the art by referencing the accompanying drawings in which.

DETAILED DESCRIPTION OF THE INVENTION

Figure 3:
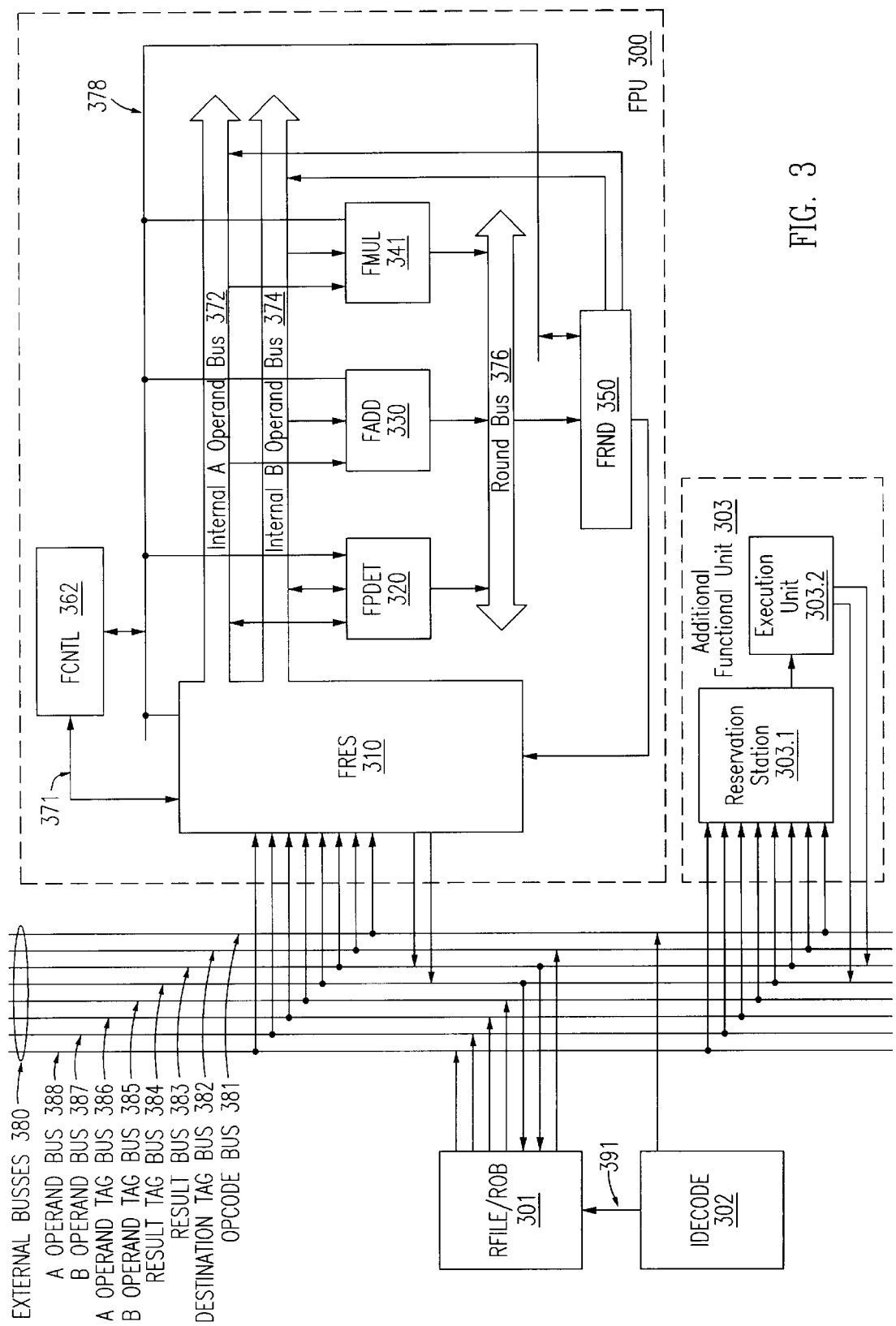
FIG. 3 is a block schematic diagram of a floating point unit incorporating a reservation station constructed in accordance with the teachings of the present invention.

FIG. 3 depicts a floating point arithmetic unit, FPU 300, for a superscalar processor. The FPU 300 includes a reservation station, FRES 310; control logic, FCNTL 362; two arithmetic units (an addition pipeline, FADD 330; and a multiplication pipeline, FMUL 341); and a rounding unit, FRND 350. Additionally, FPU 300 includes three internal busses (an internal A operand bus 372, an internal B operand bus 374, and a rounding bus 376) and an predetect unit, FPDET 320.

A reservation station is an interface which serves as an instruction and/or data buffer for a given functional unit within a processor architecture which includes multiple functional units. A processor incorporating reservation stations implements protocols for forwarding results from a given functional unit to the reservation stations of functional units waiting on the result and thereby allows an instruction to be dispatched to a functional unit prior to operand availability. The reservation station disclosed herein implements this protocol through the use of operand and result tags, wherein a match between the tag posted for a value on the result bus and an operand tag held by a given reservation station indicates that the value on the result bus should be gated into the reservation station as the operand required for the pending operation. It is understood, however, that alternate means for matching results with operand positions would also be acceptable.

FIG. 3 depicts an additional functional unit 303. Functional unit 303 is representative of any type of functional unit (e.g., an integer, branch, load/store unit, etc.) which may be included in a given superscalar processor architecture. Additional functional unit 303 is also representative of an additional floating point unit similar to FPU 300. The additional functional unit 303 incorporates a reservation station 303.1 and an execution unit 303.2. Functional unit 303 interacts with instruction decode logic, IDECODE 302, with the register file/reorder buffer, RFILE/ROB 301, and with other functional units in the manner now described for the FPU 300 and its reservation station, FRES 310. Typically, several such units would be included in a superscalar processor architecture.

The floating point reservation station, FRES 310, receives opcodes, operands, tags, and results from sources external to the FPU via a group 380 of external busses. While various well known bus designs are suitable, the use of multiple instances of each bus type (i.e., opcode, operand, operand tag, result, result tag, and destination tag busses) may be used to optimize the overall instruction bandwidth, including the dispatch and execution of non-floating point instructions. Additionally, the full width of floating point operands may be delivered to FRES 310 over multiple operand busses so as to optimize the integration of fixed and floating point functional units. The use of multiple opcode, operand, result, and tag busses is described in greater detail in a co-pending patent application Ser. No. 08/233,563 which is incorporated herein by reference, and which issued as U.S. Pat. No. 5,574,928. However, in the interests of clarity, single logical busses are assumed for the purpose of this description.

The operation of floating point unit 300 is now described with reference to FIG. 3. Opcodes for each floating point instruction are dispatched from an instruction decode unit, IDECODE 302 to the FRES unit 310 of FPU 300, via an opcode bus 381. IDECODE 302 also generates operand pointers and supplies these pointers to RFILE/ROB 301 via line 391. A suitable instruction decode unit is disclosed in a co-pending patent application Ser. No. 08/146,383, entitled "Superscalar Instruction Decoder" and naming Witt et al. as inventors, filed on 29 Oct., 1993 and incorporated herein by reference. Operand pointers serve to identify register locations within RFILE/ROB 301 which are referenced as operands by dispatched instructions. Operand data and/or tags for a given floating point operation (i.e., operands and/or operand tags for RFILE/ROB 301 locations referenced by a dispatched opcode) are provided by RFILE/ROB 301, to the FRES unit 310 of FPU 300 via external operand and tag busses. FIG. 3 depicts the external A and B operand busses (388 and 387) and the A and B operand tag busses (386 and 385). If operand data is available on instruction dispatch (e.g., if the data resides in the RFILEIROB) then data is sent from the RFILE/ROB 301 to FRES 310 over the lines of the appropriate external operand bus (i.e., the external A operand bus 388 for an A operand and the external B operand bus 387 for a B operand). If instead an operand is not yet available (i.e., if it represents the result of a pending instruction), then an operand tag is provided by RFILE/ROB 301 to FRES 310. In the embodiment of FIG. 3, this tag is provided over the appropriate operand tag bus (386 or 385). In an alternative embodiment (not shown), operand tags are provided on the lines of external A and B operand busses (analogous to 388 and 387) and operand tag busses are eliminated. In either embodiment, the tag allows FRES 310 to later receive the results of the pending operation as an operand. A and B operands are independent in that one operand may be available and is therefore sent on the appropriate external operand bus (388 or 387), while the other represents the result of a pending operation and an operand tag is dispatched instead over the appropriate operand tag bus (386 or 385).

FRES 310 also receives a destination tag for each floating point instruction via destination tag bus 382. This destination tag, which is driven onto destination tag bus 382 by the RFILE/ROB 301, is later posted by FRES 310 as a result tag on result tag bus 384. FRES 310 also drives the corresponding floating point result onto result bus 383. FRES 310 receives, via result bus 383, results of instructions which were pending (and whose results were therefore unavailable) when a given instruction was dispatched to FPU 300.

Functional units within the superscalar processor architecture disclosed (i.e., FPU 300 and additional functional units such as 303) each post a result value and an identifying result tag on the group 380 of external busses. Such a result tag may be posted either during the same bus cycle as the result value, or during an earlier bus cycle if the bus arbitration scheme so supports. By comparing the result tag on result tag bus 384 with operand tags for pending floating point instructions received and temporarily stored in FRES registers, FRES 310 recognizes results which correspond to operands of these pending instructions. FRES 310 in-gates the value appearing on result bus 383 on a tag match.

FRES 310 buffers each floating point instruction and its associated operands until two conditions are met. First, the requisite floating point arithmetic unit must be available, and second, A and B operands must both be ready (i.e., operand tag references, if any, must be resolved). The FPU 300 includes at least one arithmetic unit. In the embodiment disclosed herein, two arithmetic units are included in FPU 300: an addition pipeline, FADD 330 and a multiplication pipeline, FHUL 341. Alternate collections of arithmetic units are also possible. For example, arithmetic units configured for division, square root, trigonometric, or transcendental functions could be included, specialized units for normalization or floating point format conversion could be incorporated, and multiple instances of a given arithmetic unit type could be provided. Furthermore, in a superscalar processor incorporating multiple floating point units (e.g., FPU 300 and additional functional unit(s) 303) individual floating point units may incorporate similar or dissimilar collections of arithmetic units.

The floating point multiplication pipeline 341 depicted in FIG. 3 is of any suitable design. Pipelined floating point multipliers are well known in the art and are described in many texts and articles; see for example, Hwang and Briggs, *Computer Architecture and Parallel Processing*, McGraw-Hill Book Company, New York, 1984, pp. 170–174.

The floating point addition pipeline, FADD 330, is configured to perform floating point addition and to provide shared operand normalizing logic. Suitably configured adders and normalizing logic are well known in the art. A suitable addition pipeline configured to perform floating point addition and to provide normalizing logic for normalizing denormal operands prior to their submission to a floating point arithmetic unit is disclosed in U.S. Pat. No. 5,058,048, "Normalizing Pipelined Floating Point Processing Unit" to Gupta et al., and is incorporated herein by reference.

Figure 4:
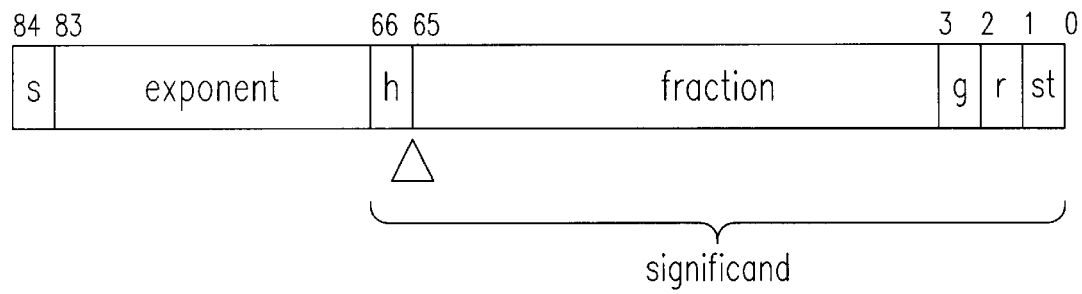
FIG. 4 is a pictorial lustration of the internal extended-precision format for a floating point number processed by the present invention.

Floating point values are represented internally in an 85-bit, extended-precision format although other internal formats may be used as well. FIG. 4 depicts the internal extended-precision format, wherein the format provides additional bits for representing exponents and significands as compared with the single-, double-, and extended-precision formats presented in FIGS. 1a, 1b, and 1c. Seventeen (17) bits of biased exponent, sixty-seven (67) bits of significand, and a single-bit sign field are provided. Within the significand, an explicit hidden bit ("h") is provided such that the binary point for a normalized floating point value falls between the hidden bit and the 63-bit fraction. Three additional bits (a guard bit, "g;" a round bit, "r;" and a sticky bit, "st") allow floating point results to be rounded exactly (by FRND 350) to a 64-bit, external extended-precision significand, i.e., rounded as if the internal format was of infinite precision.

Figure 1A:
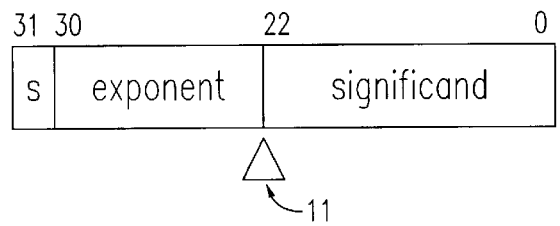
FIG. 1a is a pictorial illustration of the format of a single-precision floating point number.
Figure 1B:
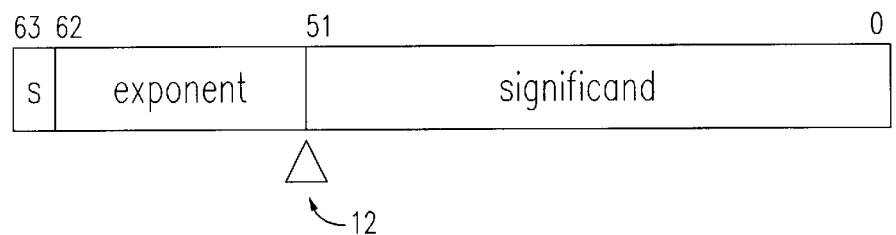
FIG. 1b is a pictorial illustration of the format of a double-precision floating point number.
Figure 1C:
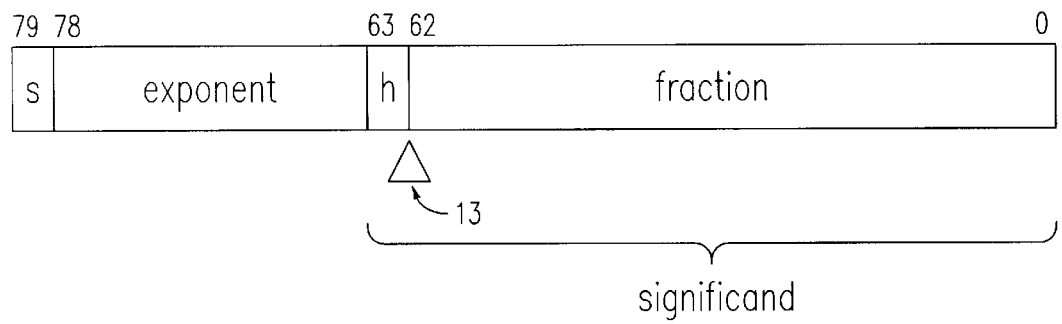
FIG. 1c is a pictorial illustration of the format of an extended-precision floating point number.
Figure 2:
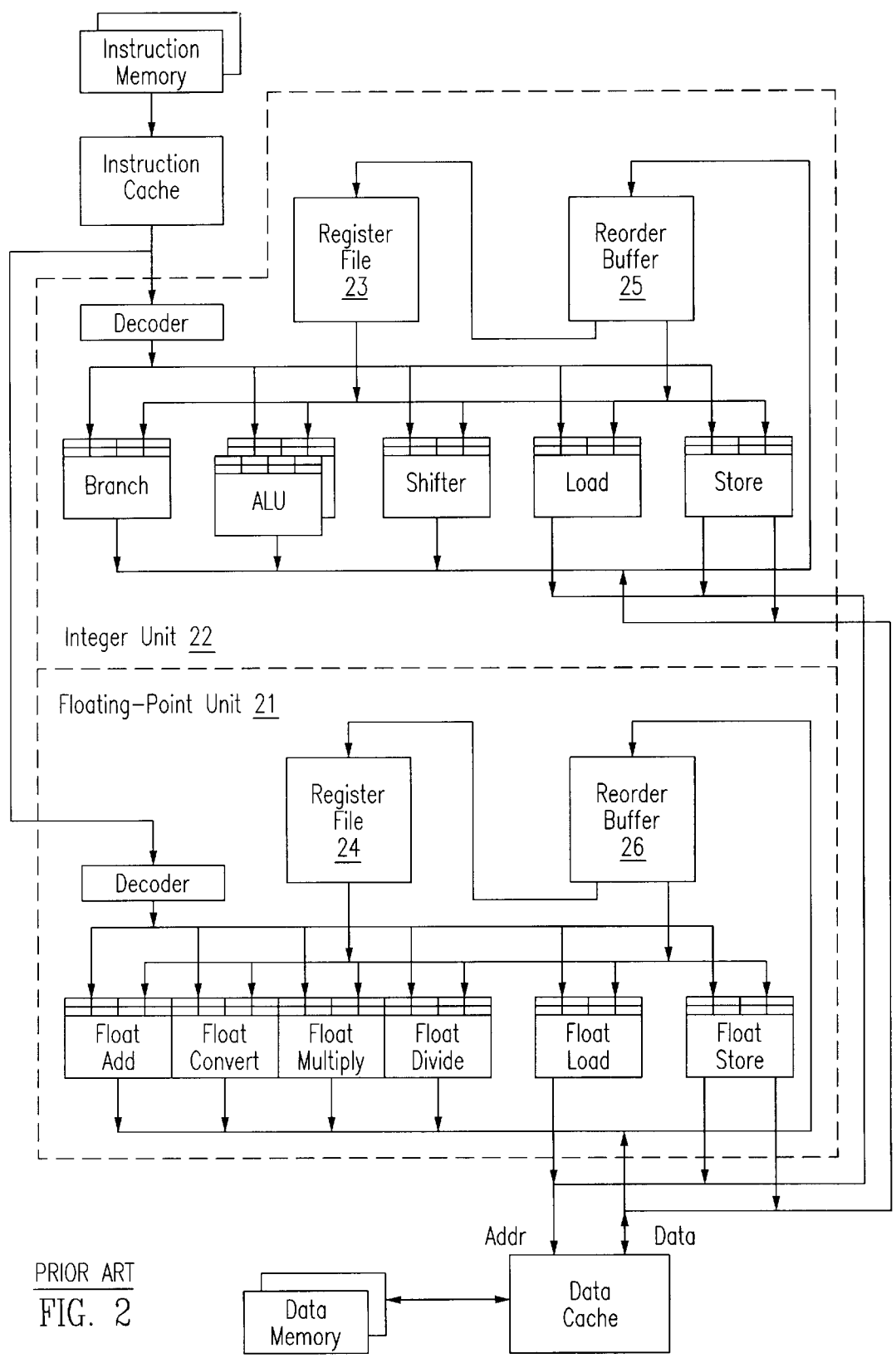
FIG. 2 is a block schematic diagram of a prior art superscalar processor design incorporating reservation stations and reorder buffers.

A and B operands are converted from external floating point formats (e.g., the single-, double-, and extended-precision formats of FIGS. 1a, 1b, and 1c) and from integer formats (e.g., 16-, 32-, and 64-bit integer formats) by FRES 310 and driven onto the internal A and B operand busses 372 and 374 in internal extendedprecision format. Each of the floating point arithmetic units (FADD 330 and FMUL 341) receives its internal extended-precision operands from busses 372 and 374 and calculates an internal extended-precision result which each drives onto the round bus 376.

In the embodiment disclosed in FIG. 3, the sign bit is not represented on the internal A and B operand busses 372 and 374 and is therefore not provided to the arithmetic units (FADD 330 and FMUL 341) or to FPDET 320. Instead, the sign bit of each operand is provided by FRES 310 to FCNTL 362 via a pair 371 of lines. FCNTL 362 determines the sign of an arithmetic result and provides the result sign directly to FRND 350, illustratively via control bus 378 although the signal need not be routed to all units on the bus. Round bus 376 also eliminates the sign bit, since the sign bit is directly provided to FRND 350.

A rounding unit, FRND 350, receives these results from round bus 376 and rounds the result in accordance with any of the four rounding modes specified by ANSI IEEE standard 754. In the embodiment disclosed, the particular rounding mode selected (which, as a general matter, is relatively static) is indicated by control signals driven over line 378 by FCNTL 362. Changes in the state of a rounding control register external to FPU 300 (not shown) require that IDECODE 302 serialize the issue of floating point instructions with respect to the change. However, because microcoded instruction sequences, e.g., for transcendental functions, may require several successive changes in rounding mode, a rounding mode is associated with each microcode instruction and provided by FRES 310 to FCNTL 362, via line 371.

FRND 350 supplies a result to FRES 310 rounded in accordance with the desired result format and with the rounding mode selected. Result formats may include single-, double-, and extended-precision floating point, as well as various integer formats (e.g., 16-, 32-, and 64-bit integers). Coincident with the provision of a rounded result by FRND 350, the floating point control unit, FCNTL 362, supplies the corresponding destination tag to FRES 310. FCNTL 362 maintains a store of destination tags received from FRES 310 (one destination tag for each floating point instruction) and propagates these destination tags through a series of latches which correspond to the internal stages of the arithmetic and non-arithmetic units within the FPU (i.e., FADD 330, FMUL 341, FPDET 320, and FRND 350). In this way, the propagation of tags through the latches corresponds to the processing of operands in various stages of the units.

FRES 310 aligns the rounded floating point result, which was supplied by FRND 350, into an external format. FRES 310 then drives an external-format, floating point (or integer) result onto result bus 383 and coincident therewith drives the corresponding result tag onto result tag bus 384. FRES 310 also compares the received destination tag to operand tags for the next floating point instruction. In this way, a floating point result value which is also the operand for the next floating point instruction may be identified. In such a case, FRES 310 fast-forwards the internal-format, floating point result received from FRND 350 onto one of the internal operand busses (372 or 374).

Floating point result values driven onto result bus 383 by FRES 310 are received by RFILE/ROB 301 and stored in a RFILE/ROB location according to the tag value on result tag bus 384. In addition, floating point result values written to result bus 383 are in-gated by the reservation station of other functional units, such as additional functional unit 303, if the result tag on result tag bus 384 corresponds to an operand tag for an instruction in the reservation station of the functional unit. Although a floating point result which corresponds to an operand for a subsequent instruction is generally passed via the fast-forward data path identified above (and described in greater detail, below), under certain conditions, the value written to the result bus 383 by FRES 310 may be in-gated as an operand from result bus 383 by the floating point reservation station itself (FRES 310). In this way, the results of one floating point instruction may be cycled back into FRES 310 as operands for a subsequent floating point instruction for which both the A and B operands are represented by as yet unresolved operand tags. An embodiment of the present invention which buffers multiple floating point instructions would also cycle floating point results back into FRES 310 via result bus 383.

FRND 350 may drive an internal extended-precision format floating point value which appears on the round bus 376 onto either the internal A or B operand bus (372 or 374) without performing a rounding operation and without driving the result to FRES 310. Such a mode of operation is used for instructions that are supported using multiple passes through an arithmetic unit or using multiple arithmetic units, such as the multiplication of denormalized floating point numbers which is implemented by first passing each denormalized operand through normalization circuitry provided in FADD 330 and then submitting the normalized operands to FMUL 341 for the multiplication. A denormalized value, also known as a denormal, is an unnormalized floating point value. The particular mode of operation for the rounding unit is selected by control signals from FCNTL 362 received by FRND 350 over control bus 378.

A predetect unit FPDET 320 also receives A and B operands in internal extended-precision format from the internal A and B operand busses 372 and 374. FPDET 320 detects such conditions as zero operands, infinity operands, not a number (NaN) operands, and denormal operands. In the embodiment disclosed, additional conditions, such as ($A_{exponent} > B_{exponent}$) and ($B_{exponent} > A_{exponent}$) are detected at FADD 330, although alternate embodiments may incorporate FPDET 320 detection logic for such conditions. Detected condition signals are provided to control logic, FCNTL 362, over control bus 378. Additionally, FPDET 320 may force arithmetic results onto round bus 376 in internal extended-precision format. The design of a predetect unit 320 with logic for bypassing arithmetic units is described in the co-pending patent application Ser. No. 08/533,812, entitled "Floating Point Processing Unit with Forced Arithmetic Results" and naming Goddard, et al. as inventor, filed on even date herewith and incorporated by reference.

Figure 5:
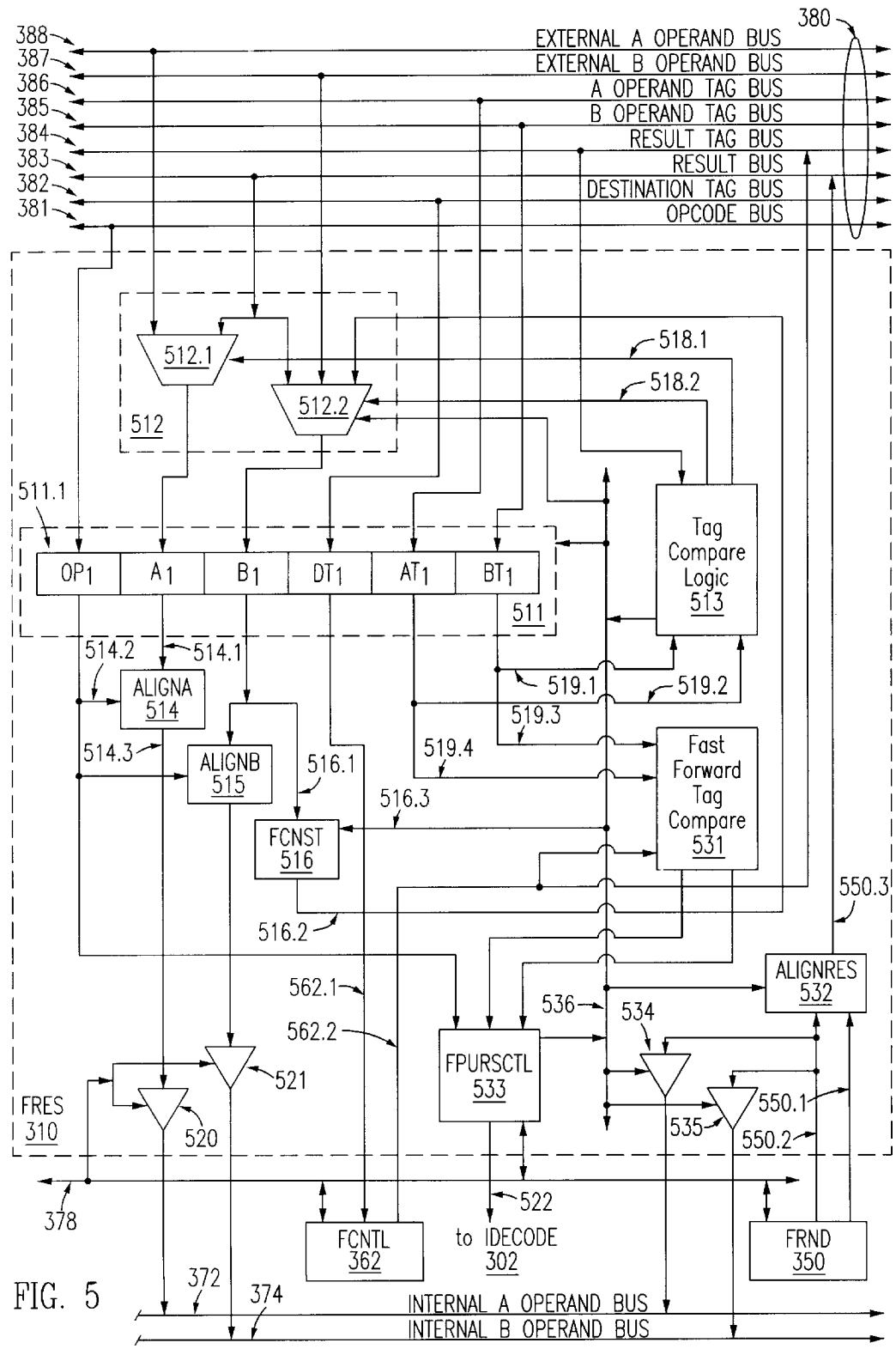
FIG. 5 is a block schematic diagram of a reservation station constructed in accordance with the teachings of the present invention.

Referring now to FIG. 5, FRES 310 includes a buffer 511 for queuing floating point instructions and associated data, tag comparison logic 513, fast-forward tag comparison logic 531, operand selection logic 512, operand format conversion logic 514 and 515, a floating point constant store 516, result format conversion logic 532, and reservation station control logic 533. A floating point instruction and its associated data (i.e., A and B operands, destination tags, and A and B operand tags) are received by FRES 310 via the group 380 of external busses and are queued in buffer 511.

In the embodiment of FIG. 5, buffer 511 is organized as a single-entry buffer; however, other buffer designs are possible. For example, buffer 511 could be implemented as a multiple entry FIFO buffer or as a multiple entry buffer with logic for implementing some other prioritized queuing order. Suitable buffer designs are well known in the art. When buffer 511 is empty, a floating point instruction (i.e., an opcode) and its associated data are gated directly into entry 511.1 when dispatched by IDECODE 302 via the group 380 of external busses. is full, a signal (FPTFULL) is driven back to IDECODE 302 on line 522 by the reservation station control logic, FPURSCTL 533, to indicate that the reservation station is full and that no additional floating point instructions should be dispatched. FPTFULL is cleared when a buffer entry is again available.

Opcodes for each floating point instruction dispatched by IDECODE 302 are received by FRES 310 via the opcode bus 381. Data associated with each opcode include the values read from the A and B operand data busses 388 and 387, A and B operand tags read from the A and B operand tag busses 386 and 385, and a destination tag read from the destination tag bus 382. These data are stored with the associated opcode in buffer 511. Literal A and B operand values may arrive with the opcode; however, if the literal values of A and/or B operands were unavailable when the current instruction was dispatched (i.e., if either or both operand values correspond to the result of another instruction which had dispatched but had not yet completed when the current instruction was dispatched), then FRES 310 must wait for the corresponding results to appear on result bus 383 before issuing the instruction to an arithmetic unit (FADD 330 or FMUL 341 FDIV 342). Tag valid bits in, or associated with, the operand tags indicate that the operand tags received from RFILE/ROB 301 (via operand tag busses 386 and 385), rather than operand data, are valid. In this case, FRES 310 compares the operand tag values buffered in 511 with result tags posted on result tag bus 384 in order to identify results on result bus 383 to be in-gated as operand data.

Tag comparison logic 513 includes a series of comparators which drive multiplexer control signals to operand selection logic 512. The tag comparison logic 513 reads the A operand tag stored in the first entry (511.1) of buffer 511 (hereinafter $AT_1$) via line 519.2 and compares it to the result tag read from result tag bus 384. If $AT_1$ matches the result tag, control line 518.1 selects the result bus input at multiplexer 512.1 and the value appearing on result bus 383 is gated-into the A operand register ($A_1$) of buffer entry 511.1. Similarly, is compared to the result tag read from result tag bus 384, a match enables the result bus input of the corresponding operand selection multiplexer (512.2), and the value on result bus 383 is gated into the corresponding operand register ($B_1$). Tag comparison logic and operand selection logic designs for a multiple entry buffer will be apparent to those skilled in the art. A given result tag may match multiple operand tags; therefore the value on result bus 383 may be gated into more than one operand register. Tag comparison logic 513 supplies signals to FPURSCTL 533 via reservation station control bus 536 which are indicative of tag matches, if any. Note that the depiction of 536 as a bus structure in FIG. 5 is merely for illustrative purposes and throughout this specification alternate control signal routings, e.g., point-to-point control lines, are envisioned.

In the embodiment disclosed, result tag values become valid during phase two ($\phi_2$) of a bus cycle, whereas result values become valid during phase two one of the same cycle. Alternative embodiments may incorporate alternate bus interface logic designs for selectively receiving result data into buffer 511. For example, the provision of result tags and result values during separate bus cycles or during a single phase of a single bus cycle are both possible. Additionally, result data identification could be performed by alternative codings. For example, identification of results could be performed using information encoded in the result data received via result bus 383.

Floating point operands arriving at FRES 310 from sources other than FPU 300, via the external A and B operand busses 388 and 387 or result bus 383, are represented in an external format (e.g., single-, double-, or external extended-precision floating point format or an integer format). The floating point unit, on the other hand, internally represents floating point values in a internal extended-precision format which includes additional exponent bits for increasing the range (magnitude) of intermediate results representable. In the embodiment disclosed, this internal extended-precision format is the 85-bit, extended-precision format shown previously in FIG. 4 which also includes additional bits in the significand to support exact rounding. Of course, alternative and/or additional internal and external formats are possible, particularly extended precision formats providing greater than 80 bits.

As a general matter, FRES 310 performs an in-line conversion of operands from external formats to internal formats. However, in the embodiment disclosed herein, operands from the floating point stack, i.e., operands arriving via the external A and B operand busses 388 and 387 from RFILE/ROB 301 entries corresponding to the x86 architectural feature of a floating point stack, are stored external to FPU 300 and arrive at FRES 310 in a reduced-precision internal format. This reduced-precision internal format is equivalent to the internal extended precision format with guard, round, and sticky bits eliminated, although other alternatives are possible.

Operands that arrive in either an external format or a reduced precision internal format are converted to an internal format by ALIGNA 514 or ALIGNB 515. Floating point results that are provided to FRES 310 from FRND 350 are rounded in accordance with the result format for a given instruction. Such a rounded result is aligned into appropriate bit positions on result bus 383 by ALIGNRES 532, where the particular realignment is determined by the result format for the corresponding instruction. If such a rounded, floating point result is also an operand for the floating point instruction queued in buffer entry 511.1, it may also be "fast-forwarded" onto the appropriate internal operand bus (372 or 374) without realignment.

Floating point format conversion logic, ALIGNA 514 and ALIGNB 515, performs the conversion of A and B operands from external formats to internal extended-precision format. Format conversion requires a bias adjustment of the exponent and a shift of the source significand bits into the correct position in the target format. In the embodiment of FIG. 5, opcode bits indicate the format of associated operands. Opcode bits are therefore supplied by buffer entry 511.1 to ALIGNA 514 and ALIGNB 515 in order to select the correct conversion.

Converted A operand data, in internal extended-precision format, is driven onto the internal A operand bus 372 by ALIGNA 514 via line 514.3 and line driver 520. In the embodiment of FIG. 5, B operand data may represent the literal value of an operand or may instead represent the index for selecting a floating point constant from the constant store, FCNST 516. In the former case, line driver 521 drives an internal extended-precision value onto the internal B operand bus 374; in the later, the contents of $B_1$ are used to index into FCNST 516 and the constant value so indexed is supplied via line 516.2 and multiplexer 512.2 where it replaces the index. After incurring a 1 cycle delay, an internal extendedprecision constant is driven onto the internal B operand bus 374 by line driver 521. Floating point constants are supplied by FCNST 516 in internal extended-precision format and therefore no format conversion is necessary. Two transformed single constants (i.e., lower precision constants) can also be stored in one FCNST 516 entry and accessed with a single index.

In the embodiment disclosed, opcode bits indicate whether B operand data represents a literal value or an index into FCNST 516. These bits are received by FPURSCTL 553. When a constant lookup is indicated, FPURSCTL 553 in turn supplies an input selection signal to multiplexer 512.2 via reservation station control bus 536. As before, the use of reservation station control bus 536 is for illustrative purposes and alternate control signal routings are envisioned. Constants are addressed in a single operand position, illustratively the B operand position, since a floating point instruction rarely operates on a pair of constants, and an equivalent sequence of two instructions is adequate given the infrequency of occurrence. FCNST 516 may be implemented as a PLA, in which case FPURSCTL 533 also supplies a PLA precharge signal, illustratively via reservation station control bus 536 and line 516.3.

FRES 310 drives an opcode valid signal (FOPVAL) to FCNTL 362 over control bus 378 indicating that the opcode stored in 511.1 ($OP_1$) and its associated data are valid. In response to the FOPVAL signal, FCNTL 362 reads $OP_1$ and then controls both the flow of operand data through the arithmetic and nonarithmetic units of the FPU (FADD 380, FMUL 341, FPDET 320, and FRND 350). FCNTL 362 also receives the destination tag from buffer entry 511.1 ($DT_1$) and propagates the destination tag through a set of internal latches in accordance with the opcode and any pipeline scheduling constraints. Once the operands are gated into the appropriate arithmetic unit, FCNTL 362 drives an operand accepted signal (FOPACC) to FPURSCTL 533, illustratively via control bus 378, which indicates that the instruction in 511.1 has been accepted by the FPU and that the contents of buffer entry 511.1 may be over written. In certain situations it is necessary to allow another arithmetic unit (e.g., FPDET 320 or FRND 350) to drive the internal A and B operand busses 372 and 374. An example is the multiplication of denormal operands wherein an arithmetic unit (illustratively, FADD 380) normalizes the denormals received from the internal A and B operand busses 372 and/or 374 and drives the resulting normalized operand onto round bus 376. FRND 350 then receives the normalized operand from round bus 376 and drives it onto the internal operand bus from which it came (i.e., either internal A operand bus 372 or internal B operand bus 374). In such a case, FCNTL 362 drives a control signal (FPSERIAL) to PRES 310, illustratively via control bus 378, which causes line drivers 520 and 521 to tri-state the FRES outputs to the internal A and B operand busses 372 and 374.

Figure 6:
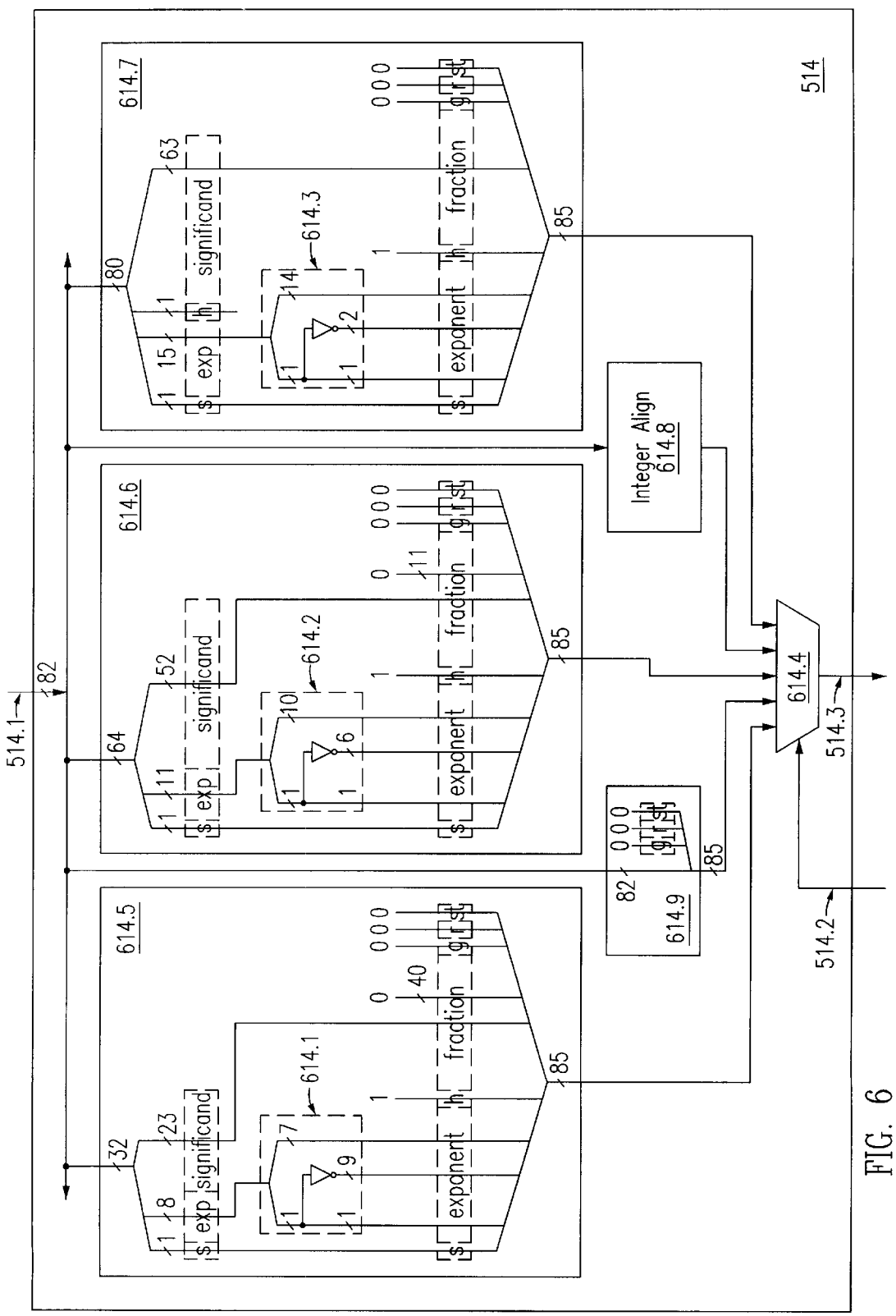
FIG. 6 a block schematic diagram of format conversion logic constructed in accordance with the teachings of the present invention.

Referring now to FIG. 6, the function and structure of conversion logic ALIGNA 514 is shown. ALIGNB 515 is of similar design. Since exponents are represented with bias, conversion between floating point formats must include bias adjustment. As noted previously, the bias on an N-bit exponent is $2^{N-1}-1$ (i.e., 7Fh for the 8-bit exponent defined for single-precision, 3FFh for the 11-bit double precision exponent, and 3FFFh for the 15-bit external extended-precision exponent). The correct adjustment to exponent bias on conversion from an external floating point format to internal extended-precision format is the difference between the bias of the target format and that of the source format. Since the exponent bias for the 17-bit exponent of internal extended-precision is FFFFh, conversion from single-precision requires a bias adjust of FFh80h, conversion from double-precision requires a bias adjust of FC00h, and conversion from external extended-precision requires a bias adjust of C000h.

Bias adjust logic can use a 17-bit adder to produce bias adjusted exponents. However, because of the particular structure of bias adjust constants and the limited bit width of source exponents, a simplified adder can be designed which consists of a single inverter. FIG. 6 depicts an embodiment which includes three simplified bias adjust adders 614.1, 614.2, and 614.3 in ALIGNA 514. The operation of bias adjust adder 614.1 is explained by the following example. The correct bias adjustment to an exponent on conversion from single-precision to internal extended precision is accomplished by adding the bias value FF80h to the 8-bit single-precision biased exponent as follows:

| | Bias Adjustment | 0_1111_1111_1000_0000 | (FF80h) |
|---|---|---|---|
| + | Exponent | 0_0000_0000_?xxx_xxxx | |
| − | Adjusted Exponent | ?_**_**_*xxx_xxxx | | where the lower 7 bits of the exponent are shown as "x" because they can represent either a 0 or a 1. The upper 9 bits are shown as 0 because the exponent is an 8-bit value (a single-precision exponent). Bit 7, "?," is the control bit of the optimized adder. Since bit 7 of the exponent is always added to a 1 and since each of the next 8 higher order bits of the bias adjust constant are equal to 1, bits 8 through 15 of the sum (i.e., of the adjusted exponent) are equal to the complement of exponent bit 7 (shown as "*") and that bit 16 of the sum is equal to exponent bit 7. Bias adjust adder 614.1 depicts an implementation of this optimized adder.

Similar adder designs may be used for bias adjustment for conversion to double-precision and external extended-precision formats. Bias adjust adder 614.2 depicts an implementation for addition of the bias adjust constant FC00h to an 11-bit double-precision exponent and bias adjust adder 614.3 depicts an implementation for addition of the bias adjust constant C000h to a 15-bit external extended-precision exponent. The remaining logic in blocks 614.5, 614.6, and 614.7 is alignment logic which shifts sign and significand bits into position within the 85-bit internal extended precision format, generates the hidden bit, and zero fills the remaining lower-order bits of the significand for each floating point conversion. Block 614.9 depicts logic for conversion of a reduced precision internal format operands to full internal extended-precision format. The conversion of block 614.9 allows the floating point stack to be represented external to FPU 300 at RFILE/ROB 301.

Integer alignment logic 614.8 converts operand data from integer formats to internal extended-precision format (recall FIG. 4). The design of integer alignment logic 614.8 (not shown) is similar to that of alignment logic shown in blocks 614.5, 614.6, and 614.7. Integer alignment is accomplished by shifting the lower n-1 bits of an n-bit integer (e.g., an 8-, 16-, 32-, or 64-bit integer) into the low-order bits of the fraction, sign extending the remaining high order bits of the fraction, shifting the sign bit (bit n) into the sign position, placing a predetermined value in the exponent field to produce a 64-bit integer encoded as an unnormalized floating point value within the normal alignment of the internal extended precision format. The predetermined exponent value is equal to the number of significand bits to the right of the implied binary point (in the target format) adjusted for the exponent bias. Thus, the value is predetermined and is independent of the integer source format. In the embodiment disclosed, wherein the target format is internal extended-precision format, the predetermined value is equal to 1003Eh (3Fh+FFFFh, where 3Fh is the hexadecimal representation of 63 decimal). Also in the embodiment disclosed, the 64-bit integer encoded as an unnormalized floating point value is sent to FADD 330 for normalization, although an alternative embodiment (not shown) with dedicated normalization circuitry in the integer alignment logic 614.8 may be implemented if desired.

In an embodiment not shown, the design of ALIGNB 515 is substantially similar to that of ALIGNA 514. However, in the embodiment of FIG. 5, which supports a stack-oriented floating point instruction set, ALIGNB 515 includes only integer to internal extended-precision conversion logic (comparable to 614.8). A stack oriented instruction set typically introduces only one new operand per instruction; therefore, the embodiment of FIG. 5 provides full operand format conversion along only one data path, illustratively the data path for the A operand. In conjunction with integer alignment logic 614.8 in the A operand data path, limited integer alignment logic in the B operand path allows arithmetic units of the FPU 300, such as FMUL 341, to be used for integer arithmetic on integer operands encoded as unnormalized internal extended precision values.

Figure 8:
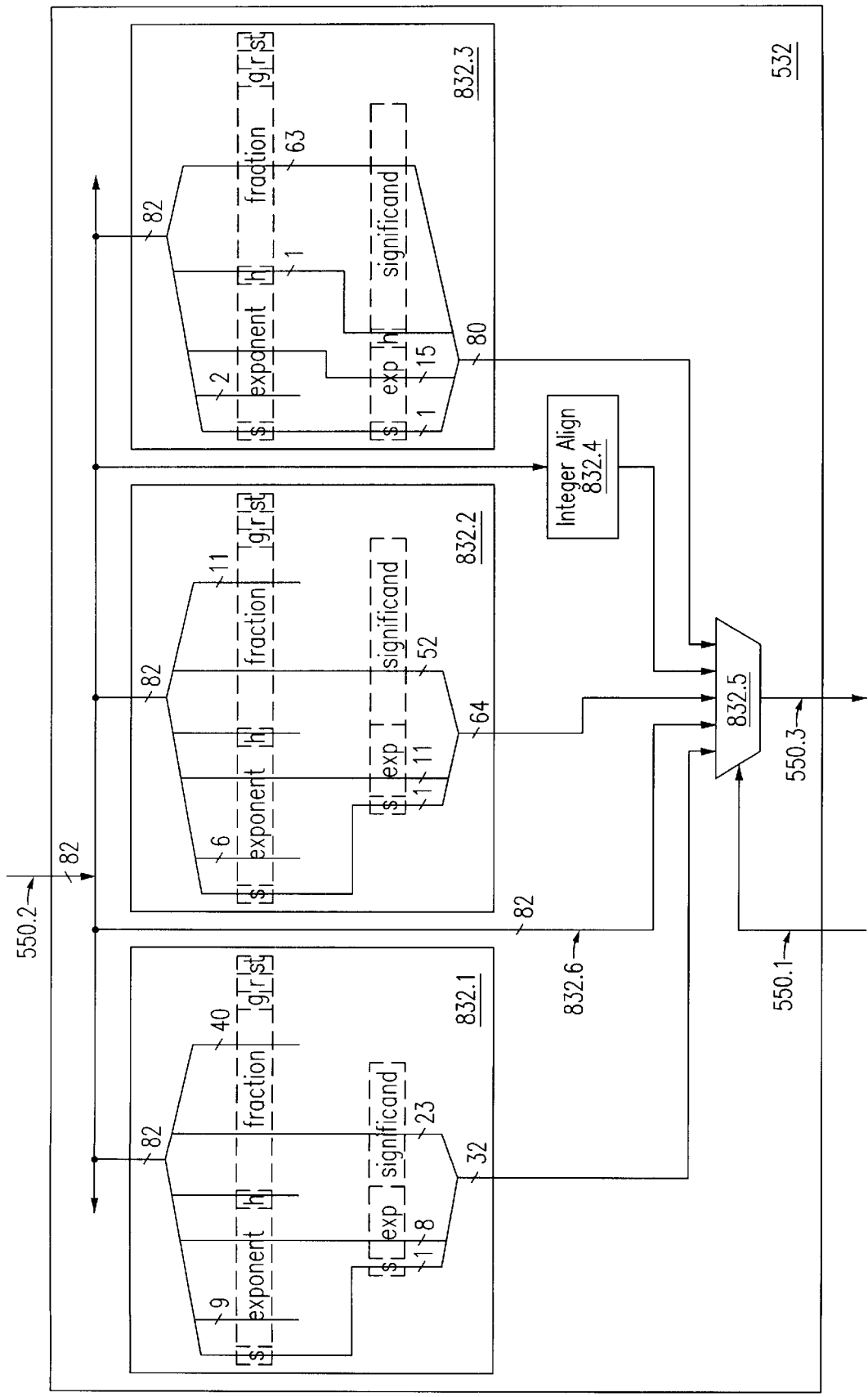
FIG. 8 is a block schematic diagram of result format conversion logic constructed in accordance with the teachings of the present invention.

FIG. 8 depicts result format conversion logic ALIGNRES 532. ALIGNRES 532 reverses the bit alignment transformations performed by corresponding alignment logic of ALIGNA 514. ALIGNRES 532 receives an 82-bit rounded result from FRND 350 and shifts certain of those 82-bits into bit positions corresponding to the result format indicated on line 550.1. Bit shifting for single-precision result format is in accordance with conversion path 832.1, whereas bit shifting for double-precision and external extended-precision result formats are in accordance with conversion paths 832.2 and 832.3, respectively. Conversion path 832.4 (which corresponds to integer alignment logic 614.8 of ALIGNA 514) similarly aligns the bits of integer formats in accordance with the integer-to-register bit mappings of the external architecture. Multiplexer 832.5 selects a particular aligned result and provides that rounded, aligned result to result bus 383 via line 550.3. Those skilled in the art will recognize that the alignment and selection logic of ALIGNRES 532 can be optimized to exploit commonality of alignment function along the various conversion paths (i.e., 832.1, 832.2, 832.3, and 832.4). For example, alignment of the sign bit and of the upper eight (8) exponent bits of each floating point format could be accomplished by common alignment logic. The depiction of FIG. 8 is therefore illustrative of the bit routings of suitable alignment logic. Suitable optimizations of such logic, including the exploitation of commonality, are envisioned as part of the embodiment disclosed herein. Line 832.6 represents a no conversion path for provision of reduced-precision internal format results (i.e., internal extended-precision without "r" "g" and "st" bits) to a floating point stack represented external to FPU 300 at RFILE/ROB 301.

Referring back to FIG. 5, rounded, but unaligned, results supplied by FRND 350 on line 550.2 are also supplied to line drivers 534 and 535 which selectively drive such results back onto either the internal A operand bus 372 or the internal B operand bus 374 in accordance with control signals supplied by FPURSCTL 533 via control bus 536. As before, the bus depiction of 536 is illustrative and alternate embodiments are envisioned. In this way results aligned in accordance with an external format are supplied on external result bus 383 and, if appropriate, the corresponding unaligned result may also be fast-forwarded onto an internal operand bus as an operand for a pending floating point instruction. Identification of particular results for fast forwarding is performed by fast-forward tag compare logic 531 which receives A and B operand tags for the pending instruction from buffer 511 via lines 519.3 and 519.4 and compares them with the destination tag received from FCNTL 362 on line 562.2. A and B operand tag matches are supplied to FCNTL 362. A tag match indicates that the result supplied on line 550.2 is an operand required for the pending instruction and should be driven directly onto the appropriate internal operand bus 372 or 374 (in addition to being aligned and supplied on result bus 383). This fast-forward path eliminates the extra bus cycle delays that would be associated with in-gating the result from the external result bus.

Although a floating point result which corresponds to an operand for a subsequent instruction is generally passed via the fast-forward data path described above, under certain conditions, the value written to the result bus 383 by FRES 310 may be in-gated as an operand from result bus 383 despite any extra bus cycle delays. In particular, the results of one floating point instruction may be cycled back into FRES 310 as operands for a subsequent floating point instruction for which both the A and B operands are represented by as yet unresolved operand tags. In such a case, only the later appearing result/operand would be supplied via the fast-forward path. Furthermore, an alternative embodiment of the present invention which includes multiple entries within buffer 511 would exploit the fast forward path for an unresolved operand of the highest priority (i.e., next) instruction queued in buffer 511, but cycle floating point results for lower priority (i.e., subsequent) instructions back into FRES 310 via result bus 383.

Incorporation of format conversion logic (e.g., ALIGNA 514, ALIGNB 515, and ALIGNRES 532) in the floating point reservation station FRES 310 enables a processor architecture to maintain floating point values in both internal and external format in the RFILE/ROB 301 and on the result bus 383. Because floating point values stored in RFILE/ROB 301 are maintained in external formats (e.g., single-, double-, and external extended-precision formats and integer formats), these RFILE/ROB 301 entries may be shared by FPU 300 and non-floating point functional units. Additional functional unit 303 is representative of any type of functional unit including non-floating point units (e.g., integer, branch, and load/store units). Typically, many such execution units would be included in a superscalar processor. Result values driven onto result bus 383 in external formats by FPU 300 and by additional functional unit 303 are received by both floating point and non-floating point functional units (i.e., both FRES 310 of FPU 300 and additional functional unit 303 in-gate external format values from result bus 383 on a tag match). Additional functional unit 303 can also be representative of an additional floating point functional unit.

By converting operand values from external formats to an internal format and thereby enabling shared RFILE/ROB 301 storage and shared use of result values on result bus 383, a floating point reservation station incorporating data format conversion logic (e.g., FRES 310 with ALIGNA 514, ALIGNB 515, and ALIGNRES 532) further enables a processor architecture to use superscalar techniques (e.g., register renaming, branch prediction, out-of-order issue, and out-of-order completion) for the exploitation of instruction parallelism between floating point and non-floating point instructions. By exploiting simplified adders (614.1, 614.2, and 614.3) for exponent bias adjustment within the format conversion logic (ALIGNA 514 and ALIGNB 515), FRES 310 performs these enabling format conversions with very low latency and complexity. Low conversion latency speeds up operations with external floating point data and allows floating point data to be maintained in registers external to FPU 310 where floating point operands are available to other functional units such as additional functional unit 303 and where superscalar techniques can be exploited for mediating data dependencies.

Floating point constants represent a special case of operand format conversion where the conversion performed is from a index value to an internal, extended precision representation of a constant. The provision of floating point constants from an addressable store is described in the co-pending patent application Ser. No. 08/533,811, entitled "Reservation Station Including Addressable Constant Store for a Floating Point Processing Unit" and naming Michael D. Goddard, et al. as inventors, filed on even date herewith and incorporated by reference. In the embodiment of FIG. 5, certain opcodes indicate that the value stored in register $B_1$ of buffer entry 511.1 represents an index into the constant store, FCNST 516, rather than a literal operand value. Alternative means for indicating that an operand value represents a constant index, such as operand-coding (rather than opcode-encoding), would also be suitable. Additionally, alternative embodiments include constant lookup functionality along both the A and B operand data paths, although such functionality would be superfluous in a floating point unit implementing a stack-oriented instruction set where only one new operand value is introduced for each instruction. In the embodiment disclosed herein, FCNST 516 receives the contents of the $B_1$ register via line 516.1. If the opcode stored in $OP_1$ indicates that the B operand value represents a constant index, FPURSCTL 533 supplies a PLA precharge signal to FCNST 516 via line 516.3 and thereafter FCNST 516 supplies an internal extended precision constant value in accordance with the constant index. FPURSCTL 533 supplies a control signal to operand selection multiplexer 512.2 selecting the constant input and the constant value overwrites the index stored in $B_1$. In an alternative embodiment (not shown) indexed constant values are driven directly onto the B operand bus from FCNST 516, rather than cycled through buffer 511. Selection logic suitable for such a directly coupled embodiment will be apparent to those skilled in the art.

With the constant index resolved and a floating point value substituted in the $B_1$ register of buffer 511, operation of FRES 310 proceeds normally. Note however, that floating point constant values so provided include two (2) additional bits of precision (effectively in the guard, "g" and round "r" bit positions of an internal extended-precision floating point representation) when compared with operands arriving either via external busses (e.g., 383, 387, or 388) or from FRND 350. As a result, the B operand register (e.g., $B_1$ of buffer 511) is slightly wider than the A operand register. The corresponding bits of B operands which arrive via external busses or from FRND 350 are zero-filled by FRES 310.

Figure 7:
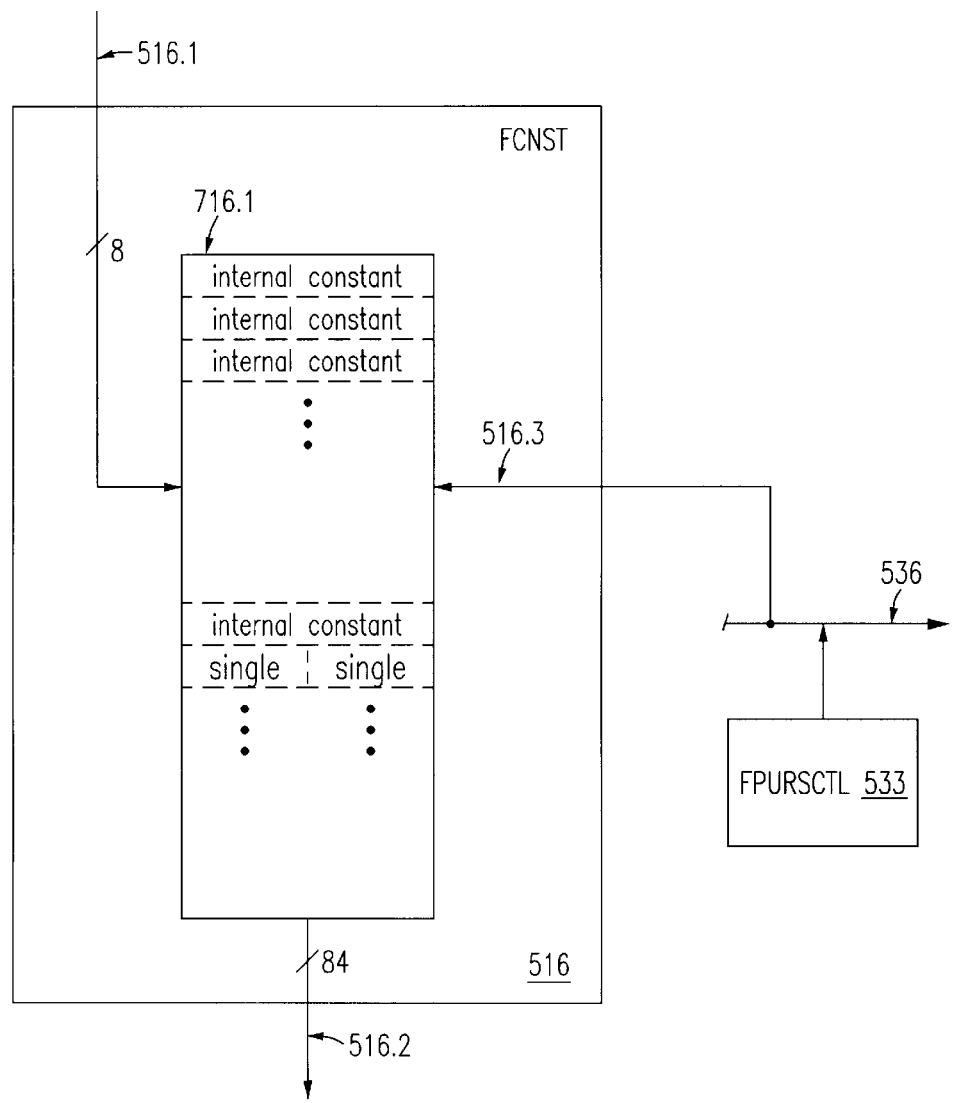
FIG. 7 is a block schematic diagram of an addressable floating point constant store constructed in accordance with the teachings of the present invention.

FIG. 7 shows the organization of the floating point constant store, FCNST 516. FCNST 516 is an addressable store 716.1 of constants represented in internal extended-precision format. In the embodiment disclosed, up to 256 floating point values, including representations of pi, e, and polynomial series constants for the calculation of transcendental functions, are stored in addressable store 716.1. In the embodiment disclosed in FIG. 7, addressable store 716.1 is implemented as an 8-input, 84-output PLA, where an eight bit index on line 516.1 serve to address into the store. An 84-bit floating point constant value (full internal extended-precision format, absent the sticky bit) is supplied on 516.2. Alternatively, two lower precision single constants can be supplied in a single access.

While the invention has been described with reference to various embodiments, it will be understood that these embodiments are illustrative and that the scope of the invention is not limited to them. Many variations, modifications, additions, and improvements of the embodiments described are possible. For example, alternative sets of internal and external formats are possible. Additionally, overlapping sets of internal and external formats are possible, wherein a given data format may be used both internally and externally. Operand valves represented in such a format would require no conversion. Furthermore, reservation station implementations for both stack-oriented and non-stack-oriented floating point instruction sets are envisioned. These and other variations, modifications, additions, and improvements may fall within the scope of the invention as defined in the claims which follow.

What is claimed is:

1. In a processor having plural functional units coupled to a common opcode bus, a common operand bus, and a common result bus, a reservation station for a floating point

19 functional unit having an arithmetic unit with an operand input and a result output the reservation station comprising:

a pending instruction buffer including an operand data register and an opcode register coupled to the common opcode bus for receiving opcodes for floating Point instructions;

first format conversion logic coupled between the operand data register and the operand input of the arithmetic unit for supplying the arithmetic unit with operand data selectively converted from one of a set of external data formats to one of a set of internal data formats, wherein the said first format conversion logic is coupled to the opcode register, individual opcodes being indicative of operand data format and selective for particular conversion performed by the first format conversion logic, wherein said first format conversion logic comprises a bit alignment logic and a bias adjust adder;

a fast-forward data path coupled between the result output of the arithmetic unit and the operand input of the arithmetic unit, the fast-forward data path selectively supplying, substantially without data format conversion, the arithmetic unit with a result data value;

a second format conversion logic coupled between the result output of the arithmetic unit and the common result bus, the second format conversion logic receiving a result data value in one of the set of internal data formats, wherein the set of said internal data formats includes internal extended-precision format, converting the result data value to one of the set of external data formats, wherein the set of said external data formats includes single-precision floating point format, double-precision floating point format, external extended-precision floating point format and 16-, 32-, and 64-bit integer formats, and supplying the converted result data value on the common result bus.

2. A reservation station as recited in claim 1 wherein the bias adjust adder comprises an N-bit exponent input, an inverter, and an M-bit exponent output, the $N^{th}$ input bit coupled to the $M^{th}$ output bit, input bits N−1 through 1 coupled to output bits N−1 through 1, respectively, and the inverter coupled between the $N^{th}$ input bit and output bits M−1 through N, wherein M is greater than N.

3. In a processor having plural functional units coupled to a common opcode bus, a common operand bus, and a common result bus, a reservation station for a floating point functional unit having an arithmetic unit with an operand input and a result output, the reservation station comprising:

a pending instruction buffer including an operand data register;

first format conversion logic coupled between the operand data register and the operand input of the arithmetic unit for supplying the arithmetic unit with operand data selectively converted from one of a set of external data formats to one of a set of internal data formats, the first format conversion logic including a bias adjust adder including an N-bit exponent input, an inverter, and an M-bit exponent output, the $N^{th}$ input bit coupled to the $M^{th}$ output bit, input bits N−1 through 1 coupled to output bits N−1 through 1, respectively, and the inverter coupled between the $N^{th}$ input bit and output bits M−1 through N, wherein M is greater than N; and a fast-forward data path coupled between the result output of the arithmetic unit and the operand input of the arithmetic unit, the fast-forward data path selectively supplying the arithmetic unit with a result data value.

4. In a processor having plural finctional units coupled to a common opcode bus, a common operand bus, and a

20 common result bus, a reservation station for a floating point functional unit having an arithmetic unit with an operand input and a result output, the reservation station comprising:

a pending instruction buffer including an operand data register;

first format conversion logic coupled between the operand data register and the operand input of the arithmetic unit for supplying the arithmetic unit with operand data selectively converted from one of a set of external data formats to one of a set of internal data formats;

second format conversion logic coupled between the result output of the arithmetic unit and the common result bus, the second format conversion logic receiving a result data value in one of the internal data formats, converting the result data value to one of the external data formats, and supplying the converted result data value on the common result bus;

a fast-forward data path coupled between the result output of the arithmetic unit and the operand input of the arithmetic unit, the fast-forward data path selectively supplying the arithmetic unit with a result data value; and a rounding complex comprising:
a round bus coupled to the result output of the arithmetic unit; and
a rounding unit having an input coupled to the round bus and an output coupled to the second format conversion logic;

the rounding complex thereby coupling the result output of the arithmetic unit to the second format conversion logic.

5. In a processor having plural fuinctional units coupled to a common opcode bus, a common operand bus, and a common result bus, a reservation station for a floating point finctional unit having an arithmetic unit with an operand input and a result output, the reservation station comprising:

a pending instruction buffer including an operand data register;

first format conversion logic coupled between the operand data register and the operand input of the arithmetic unit for supplying the arithmetic unit with operand data selectively converted from one of a set of external data formats to one of a set of internal data formats;

second format conversion logic coupled between the result output of the arithmetic unit and the common result bus, the second format conversion logic receiving a result data value in one of the internal data formats, converting the result data value to one of the external data formats, and supplying the converted result data value on the common result bus;

a fast-forward data path coupled between the result output of the arithmetic unit and the operand input of the arithmetic unit, the fast-forward data path selectively supplying the arithmetic unit with a result data value;

first detecting means for detecting a correspondence between an instruction buffered in the pending instruction buffer and the result data value, the first detecting means coupled between the pending instruction buffer and the fast-forward data path, correspondence detection causing the first detecting means to selectively enable the fast-forward data path; and a rounding complex comprising:
a round bus coupled to the result output of the arithmetic unit; and
a rounding unit having an input coupled to the round bus and an output coupled to the second format conversion logic;

the rounding complex thereby coupling the result output of the arithmetic unit to the second format conversion logic and to the fast forward data path.

6. A floating point functional unit as recited in claim 5, wherein the floating point functional unit further includes an additional arithmetic unit having an operand input coupled to the internal operand bus and a result output coupled to the round bus.

7. A floating point functional unit as recited in claim 6, wherein the arithmetic unit and the additional arithmetic unit are each selected from the set of arithmetic units which includes an addition pipeline, a multiplication pipeline, a division unit, a square root unit, and specialized units for trigonometric functions, transcendental function, normalization, and floating point format conversion.

8. A floating point functional unit as recited in claim 7, wherein the additional arithmetic unit and the arithmetic unit are substantially similar units.

9. A floating point functional unit as recited in claim 6, wherein the additional arithmetic unit comprises a multiplication pipeline and the arithmetic unit comprises an addition pipeline.

10. In a processor having an operand bus for furnishing operand data in a plurality of first data formats to functional units, an opcode bus for furnishing opcodes to functional units, and a result bus for communicating result data from functional units in the first data format, a reservation station for a floating point functional unit having an arithmetic unit for operating on operand data in a second data format, the reservation station comprising:

an array of register stages, the array having an operand input coupled to the operand bus, an operand output, an opcode input coupled to the opcode bus, and an opcode output, each register stage comprising an operand data register and an opcode register;

bus interface logic for selectively receiving result data from the result bus into the operand data registers of the array, wherein the data selectively received are operands for opcodes stored in the opcode registers of the array; and a data format converter for selectively converting operand data from the plurality of first data formats to the second data format, the data format converter having a data input coupled to the operand output of the array, a control port coupled to the opcode output of the array for selecting the format conversion performed, and an data output coupled to the arithmetic unit, the data format converter including a bias adjust adder comprising an N-bit exponent input, an inverter, and an M-bit exponent output, the $N^{th}$ input bit coupled to the $M^{th}$ output bit, input bits N−1 through 1 coupled to output bits N−1 through 1, respectively, and the inverter coupled between the $N^{th}$ input bit and output bits M−1 through N, wherein M is greater than N.

11. A reservation station as in claim 10 wherein the plurality of first data formats include single-precision floating point format, double-precision floating point format, and external extended-precision floating point format, and wherein the second data format is internal extended-precision floating point format.

12. A reservation station as in claim 11, wherein the plurality of first data formats further includes an integer data format.

13. A reservation station as in claim 12, wherein the integer data format is one of 16-bit signed integer format, 32-bit signed integer format, and 64-bit signed integer format.

14. A reservation station as in claim 10 wherein the array register stages is a single stage buffer.

15. In a reservation station having a data format converter for selectively converting operand data from a first data format to a second data format, a bias adjust adder comprising:

an N-bit exponent input;

an M-bit exponent output, wherein M is greater than N, wherein the $N^{th}$ bit of the exponent input is coupled to the $M^{th}$ bit of the exponent output, and wherein bits N−1 through 1 of the exponent input are respectively coupled to bits N−1 through 1 of the exponent output; and an inverter coupled between the $N^{th}$ bit of the exponent input and bits M−1 through N of the exponent output.

16. A superscalar digital computer having plural functional units, the superscalar digital computer comprising:

an instruction decoder having a first output for furnishing instruction data and a second output for furbishing operand pointers;

a data store having an input to receive results into the data store and an output to furnishing selected data as operands, the data store storing data in a first format;

an operand selection port coupled to the second output of the instruction decoder to select operands from the data store;

an operand bus coupled to the output of the data store to furnish first format operands to functional units;

a result bus coupled to the input of the data store to communicate first format results from functional units to the data store;

a first functional unit for performing an operation on operands in response to a first-type instruction received from the first output of the instruction decoder, the first functional unit including:

a first reservation station including:

a first operand buffer coupled to the operand bus to receive first format operands and coupled to the result bus to selectively receive first format results as operands;

first format conversion logic coupled to the first operand buffer to receive and convert first format operand data to a second format; and a fast-forward data path coupled between the result output of the arithmetic unit and the operand input of the arithmetic unit, the fast-forward data path selectively supplying, substantially without data format conversion, the arithmetic unit with the first format result;

an arithmetic unit coupled to the first format conversion logic to receive second format operands at an operand input and to perform arithmetic operations in the second format, the arithmetic unit furnishing results at a result output in the second format; and second format conversion logic coupled between the result output of the arithmetic unit and the result bus to convert second format results to the first data format; and a second functional unit for performing operations on operands in response to a second-type instruction received from the first output of the instruction decoder, the second functional unit including:

a second reservation station having a second operand buffer coupled to the operand bus to receive first format operands and coupled to the result bus to selectively receive first format results as operands; and an execution unit coupled to the second operand buffer to receive first format operands and to perform operations in the first format, the execution furnishing first format results to the result bus.

17. A superscalar digital computer system as in claim 16 wherein the first functional unit is a floating point functional unit, wherein the first format includes single-precision floating point format, double-precision floating point format, wherein the second format includes internal extended-precision floating point format, wherein first format conversion logic selectively converts from ones of the first format to the ones of the second format and second format conversion logic selectively converts from ones of the second format to ones of the first format.

18. A superscalar digital computer system as in claim 16 wherein the first reservation station further includes:
   a pending instruction store associated with the first operand buffer, the pending instruction store coupled to the instruction decoder to receive a first-type instruction; and
   means for detecting a correspondence between an operand for an instruction buffered in the pending instruction store and the first format result, the detecting means coupled between the pending instruction store and the fast-forward data path, correspondence detection causing the detecting means to selectively enable the fast-forward data path.

19. A reservation station as recited in claim 17 wherein the first format further includes 16-, 32-, and 64-bit integer formats.

20. A reservation station as recited in claim 19 wherein the first format conversion logic selectively converts an integer operand from 16-, 32-, and 64-bit integer formats to encode the integer operand as an unnormalized floating point value within the normal alignment. of the internal extended-precision format, selective conversion of the integer operand allowing the arithmetic unit of the floating point functional unit to operate on integer operands.

21. A reservation station as recited in claim 18 wherein the first format conversion logic selectively passes second format operands and the second format conversion logic selectively passes second format results to allow representation of a floating point register structure at the data store.

22. A reservation station as recited in claim 21 wherein the data store comprises a register file/reorder buffer, wherein the floating point register structure includes an x86 floating point stack, and wherein first and second format conversion logic allow first and second format operands to be represented external to the floating point functional unit in the register file/reorder buffer.

23. In a reservation station for a floating point unit having an arithmetic unit, a method of converting floating point operands from a plurality of first data formats, each first data format including a sign, an exponent, and a significand, to a second data format, the second data format including a sign, an exponent, and a significand, the method comprising:
   receiving an instruction having an opcode and an operand, the operand being represented in one of the plurality of first data formats and the opcode being indicative of the data format of the operand;
   storing the instruction received in the instruction receiving step in an buffer;
   retrieving the instruction, including the opcode and the operand stored in the instruction storing step, from the buffer;
   determining the format of the operand retrieved in the instruction retrieval step by examining the opcode retrieved in the instruction retrieval step;
   converting the operand retrieved in the instruction retrieval step to the second data format, the operand conversion step comprising the steps of:
      supplying a sign bit equivalent to the sign of the operand retrieved in the instruction retrieval step;
      supplying a converted exponent field by adjusting the bias on the exponent of the operand retrieved in the instruction retrieval step, the bias adjustment being equal to the difference between the exponent bias for the second data format and the exponent bias for the format determined in the format determination step;
      supplying a converted significand field by shifting the significand of the operand retrieved in the instruction retrieval step into the most significant bits of the converted significand field and by zero-filling any remaining lower order bits of the converted significand field; and
      issuing the instruction, including the opcode retrieved in the instruction retrieval step and the sign bit, converted exponent field, and converted significand field supplied in the operand conversion step, to the arithmetic unit.

24. A method as in claim 23 wherein the plurality of first data formats include single-precision floating point format, double-precision floating point format, and external-extended precision floating point format, and wherein the second data format is internal extended-precision floating point format.

25. A method as in claim 23 wherein the bias adjustment in the converted exponent field supplying step is performed by addition of a predetermined bias adjustment constant to the exponent of the operand retrieved in the instruction retrieval step, the predetermined constant being equal to the difference between the exponent bias for the second data format and the exponent bias for the format determined in the format determination step, and wherein addition is performed using an adder consisting of a single inverter.

26. A functional unit for a processor having an opcode bus, an operand bus, an operand tag bus, a result bus, and a result tag bus, comprising:
   a memory having a floating point opcode field, an operand field, and an operand tag field;
   a write path for controllably writing operation parameters from the opcode bus, the operand bus, and the tag bus to selected fields of the memory, the operation parameters including for first-type write events an opcode from the opcode bus and an operand in a first external format from the operand bus;
   a read path for controllably issuing operands in the first external format from the memory in order;
   a first format converter for converting the operands issued from the read path from the first external format to an internal format, the first format converter including a bias adjust adder comprising an N-bit exponent input, an inverter, and an M-bit exponent output, the $N^{th}$ input bit coupled to the $M^{th}$ output bit, input bits N−1 through 1 coupled to output bits N−1 through 1, respectively, and the inverter coupled between the $N^{th}$ input bit and output bits M−1 through N, wherein M is greater than N;
   an execution unit for furnishing a result based on an operation on the internally formatted operands from the format converter, the result being in an internal format; and
   a second format converter for converting the result from the execution unit from the internal format to a second external format.

27. A functional unit as in claim 26 wherein the memory is a single entry memory having multiple fields for operation parameters corresponding to a single instruction.

28. A functional unit as in claim 26 wherein the memory is a multiple entry memory, each entry having multiple fields for operation parameters corresponding to a single instruction, and wherein the write path controllably writes operation parameters from the opcode bus, the operand bus, and the tag bus to selected fields of selected entries of the memory.

29. A functional unit as in claim 26 wherein the execution unit is a floating point arithmetic unit, and wherein the first external format and the second external format are each independently selected from a set of external formats including single-precision floating point format, double-precision floating point format, and external extended-precision floating point format, and wherein the internal format is internal extended-precision format.

30. A functional unit as in claim 29 wherein the first external format and the second external format are the same format.

31. A functional unit as in claim 29 wherein the set of external formats further includes 16-, 32-, and 64-bit integer formats.

32. A functional unit as recited in claim 31 wherein the first format converter selectively converts an integer operand from external 16-, 32-, and 64-bit integer formats to encode the integer operand as an unnormalized floating point value within the normal alignment of the internal extended-precision format, and wherein the second format converter selectively converts an unnormalized floating point result value to one of the external 16-, 32-, and 64-bit integer formats, selective conversion of the integer operand allowing the arithmetic unit to operate on integer operands and supply integer results.

33. A functional unit as in claim 26 wherein the operation parameters further includes for second type write events an opcode from the opcode bus and an operand tag from the operand tag bus, and for third type write events a result tag from the result tag bus and a result from the result bus; the functional unit further comprising:

a match detection circuit for detecting a match between the result tag on the result tag bus and any of the operand tags in the memory; and a memory update path responsive to the match detection circuit for writing the result from the result bus to the operand field of the memory entry containing the matching operand tag.

34. In a processor having plural functional units coupled to forward results thereamong, a reservation station for a first of said functional units, said reservation station comprising:

first format conversion logic coupled into an operand data path to an arithmetic unit of said first functional unit to suilly said arithmetic unit with operand data selectively converted from one of a set of external data formats to one of a set of internal data formats; wherein said first format conversion logic includes a bias adjust adder comprising:

an N-bit exponent input, an inverter, and an M-bit exponent output, M greater than N, wherein an Mth bit of said exponent output is coupled to an Nth bit of said exponent input, wherein bits N−1 through 1 of said exponent input, and wherein said inverter is coupled to invert said Nth bit of said exponent input and supply said inverted bit as bits M−1 through N of said exponent output; and a fast-forward data path coupled between a result output of said arithmetic unit and a first operand input of said arithmetic unit to selectively supply, substantially without data format conversion, said arithmetic unit with result data.

35. A reservation station, as recited in claim 34, wherein M is selected in accordance with a desired bias adjust constant.

36. A bias adjust adder comprising:

an N-bit exponent input, an inverter, and an M-bit exponent output, M greater than N, wherein an $M^{th}$ bit of said exponent output is coupled to an $N^{th}$ bit of said exponent input, wherein bits N−1 through 1 of said exponent output are respectively coupled to bits N−1 through 1 of said exponent input, and wherein said inverter is coupled to invert said $N^{th}$ bit of said exponent input and supply said inverted bit as bits M−1 through N of said exponent output.

* * * * *